(12) United States Patent
Li et al.

(10) Patent No.: US 12,048,172 B2
(45) Date of Patent: Jul. 23, 2024

(54) SOLID-STATE IMAGE SENSOR

(71) Applicant: VisEra Technologies Company Limited, Hsin-Chu (TW)

(72) Inventors: Ching-Hua Li, Taoyuan (TW); Zong-Ru Tu, Zhubei (TW); Yu-Chi Chang, Hukou Township, Hsinchu County (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 237 days.

(21) Appl. No.: 17/466,297

(22) Filed: Sep. 3, 2021

(65) Prior Publication Data

US 2023/0073737 A1    Mar. 9, 2023

(51) Int. Cl.
*H01L 27/146* (2006.01)
*H10K 30/00* (2023.01)
(Continued)

(52) U.S. Cl.
CPC ........... *H10K 39/32* (2023.02); *H10K 30/451* (2023.02); *H10K 30/82* (2023.02)

(58) Field of Classification Search
CPC ...... H10K 39/32; H10K 30/451; H10K 30/82; Y02E 10/549; H01L 27/14625;
(Continued)

(56) References Cited

U.S. PATENT DOCUMENTS

| 2017/0357031 A1 | 12/2017 | Ahmed et al. |
| 2018/0027171 A1* | 1/2018 | Yoshimura ............. G02B 7/365 257/40 |

(Continued)

FOREIGN PATENT DOCUMENTS

| CN | 111477645 A | 7/2020 |
| JP | 2010-239003 A | 10/2010 |

(Continued)

OTHER PUBLICATIONS

Office Action corresponding to JP application No. 2022-043525 issued on May 9, 2023 with English translation.

(Continued)

*Primary Examiner* — Samuel Park
(74) *Attorney, Agent, or Firm* — Muncy, Geissler, Olds & Lowe, P.C.

(57) ABSTRACT

A solid-state image sensor is provided. The solid-state image sensor includes a semiconductor substrate having photoelectric conversion elements. The solid-state image sensor also includes an isolation structure disposed between the photoelectric conversion elements. The solid-state image sensor further includes a color filter layer disposed above the semiconductor substrate and having color filter segments that correspond to the photoelectric conversion elements. Moreover, the solid-state image sensor includes an organic film disposed above the color filter layer. The solid-state image sensor also includes an upper electrode and a lower electrode respectively disposed on the upper side and the lower side of the organic film. The solid-state image sensor further includes nano-structures disposed on the upper side or the lower side of the organic film.

16 Claims, 7 Drawing Sheets

(51) Int. Cl.
*H10K 30/82* (2023.01)
*H10K 39/32* (2023.01)

(58) Field of Classification Search
CPC .......... H01L 27/14627; H01L 27/1463; H01L 27/14643; H01L 27/14645; H01L 27/14665; H01L 27/14621
See application file for complete search history.

(56) References Cited

U.S. PATENT DOCUMENTS

| | | | |
|---|---|---|---|
| 2018/0114814 A1* | 4/2018 | Yun | H10K 39/32 |
| 2018/0204882 A1* | 7/2018 | Segawa | H01L 27/14 |
| 2019/0081251 A1* | 3/2019 | Obana | H10K 39/30 |
| 2019/0088693 A1* | 3/2019 | Kato | H01L 27/14687 |
| 2019/0148457 A1 | 5/2019 | Lee et al. | |
| 2019/0157336 A1 | 5/2019 | Kim et al. | |
| 2019/0157594 A1* | 5/2019 | Ro | H10K 85/626 |
| 2019/0165026 A1* | 5/2019 | Kuo | H01L 27/1463 |
| 2019/0371861 A1 | 12/2019 | Kim et al. | |
| 2020/0395564 A1 | 12/2020 | Yun et al. | |
| 2020/0403025 A1 | 12/2020 | Kim et al. | |
| 2021/0024544 A1 | 1/2021 | Shin et al. | |
| 2021/0118956 A1 | 4/2021 | Park et al. | |
| 2021/0234103 A1 | 7/2021 | Lim et al. | |
| 2021/0273180 A1 | 9/2021 | Park et al. | |

FOREIGN PATENT DOCUMENTS

| | | |
|---|---|---|
| JP | 2014-127545 A | 7/2014 |
| JP | 2015-50331 A | 3/2015 |
| JP | 2018-133357 A | 8/2018 |
| JP | 2018133357 A * | 8/2018 |
| KR | 10-0670857 B1 | 1/2007 |
| KR | 10-2013-0035580 A | 4/2013 |
| KR | 10-2019-0034791 A | 4/2019 |
| KR | 10-2020-0145978 A | 12/2020 |
| TW | 201503336 A | 1/2015 |
| TW | 201515201 A | 4/2015 |
| TW | 202125797 A | 7/2021 |
| TW | 202133419 A | 9/2021 |
| WO | WO2017/010262 A1 | 1/2017 |
| WO | WO2018/173754 A1 | 9/2018 |

OTHER PUBLICATIONS

Office Action from corresponding TW Application No. 111106720 issued on Oct. 21, 2022, 9 pages.

Office Action corresponding KR application No. 10-2021-0188644 issued on Aug. 18, 2023 and English translation, 12 pages.

* cited by examiner

SOLID-STATE IMAGE SENSOR

BACKGROUND

Technical Field

The embodiments of the present disclosure relate to image sensors, and in particular they relate to solid-state image sensors that include nano-structures.

Description of the Related Art

Solid-state image sensors (e.g., charge-coupled device (CCD) image sensors, complementary metal-oxide semiconductor (CMOS) image sensors, and so on) have been widely used in various image-capturing apparatuses such as digital still-image cameras, digital video cameras, and the like. The light sensing portion in the solid-state image sensor may be formed at each of pixels, and signal electric charges may be generated according to the amount of light received in the light sensing portion. In addition, the signal electric charges generated in the light sensing portion may be transmitted and amplified, whereby an image signal is obtained.

An organic photoelectric conversion film may be formed in some solid-state image sensors. However, a thicker organic photoelectric conversion film would be needed to improve the photoelectric conversion efficiency of the organic photoelectric conversion film.

BRIEF SUMMARY

In some embodiments of the present disclosure, the solid-state image sensor includes nano-structures disposed on the upper side and/or the lower side of the organic film (e.g., organic photoelectric conversion film), which may effectively enhance the photoelectric conversion efficiency, thereby improving the quality of the image signal from the photoelectric conversion elements of the solid-state image sensors.

In accordance with some embodiments of the present disclosure, a solid-state image sensor is provided. The solid-state image sensor includes a semiconductor substrate having photoelectric conversion elements. The solid-state image sensor also includes an isolation structure disposed between the photoelectric conversion elements. The solid-state image sensor further includes a color filter layer disposed above the semiconductor substrate and having color filter segments that correspond to the photoelectric conversion elements. Moreover, the solid-state image sensor includes an organic film disposed above the color filter layer. The solid-state image sensor also includes an upper electrode and a lower electrode respectively disposed on the upper side and the lower side of the organic film. The solid-state image sensor further includes nano-structures disposed on the upper side or the lower side of the organic film.

In some embodiments, the organic film has organic segments.

In some embodiments, the solid-state image sensor further includes a grid structure disposed between the color filter segments.

In some embodiments, the refractive index of the grid structure is lower than the refractive index of the color filter layer.

In some embodiments, the grid structure is also disposed between the organic segments.

In some embodiments, the refractive index of the grid structure is lower than the refractive index of the organic film.

In some embodiments, the isolation structure is also disposed between the color filter segments.

In some embodiments, the isolation structure is further disposed between the organic segments.

In some embodiments, the length of the nano-structures in each organic segment is between 200 μm and 500 μm.

In some embodiments, the nano-structures are disposed inside the organic film.

In some embodiments, the nano-structures are disposed on the upper side of the upper electrode.

In some embodiments, the lower electrode has electrode segments that correspond to the photoelectric conversion elements.

In some embodiments, one of the electrode segments includes a first electrode segment and a second electrode segment that correspond to one color filter segment.

In some embodiments, the length of the first electrode segment is different from the length of the second electrode segment.

In some embodiments, the organic film has organic segments, and the first electrode segment and the second electrode segment are disposed on the lower side of a specific organic segment of the organic segments.

In some embodiments, the length of the nano-structures in the specific organic segment corresponds to the length of the first electrode segment.

In some embodiments, the nano-structures are a portion of the upper electrode or the lower electrode.

In some embodiments, each nano-structure is formed into a triangular pyramid, a cone, or a quadrangular pyramid.

In some embodiments, the nano-structures include a transparent conductive material or a metal.

In some embodiments, the solid-state image sensor includes a condensing structure disposed on the organic film, and the condensing structure includes micro-lenses that correspond to the color filter segments.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

Figure 1:
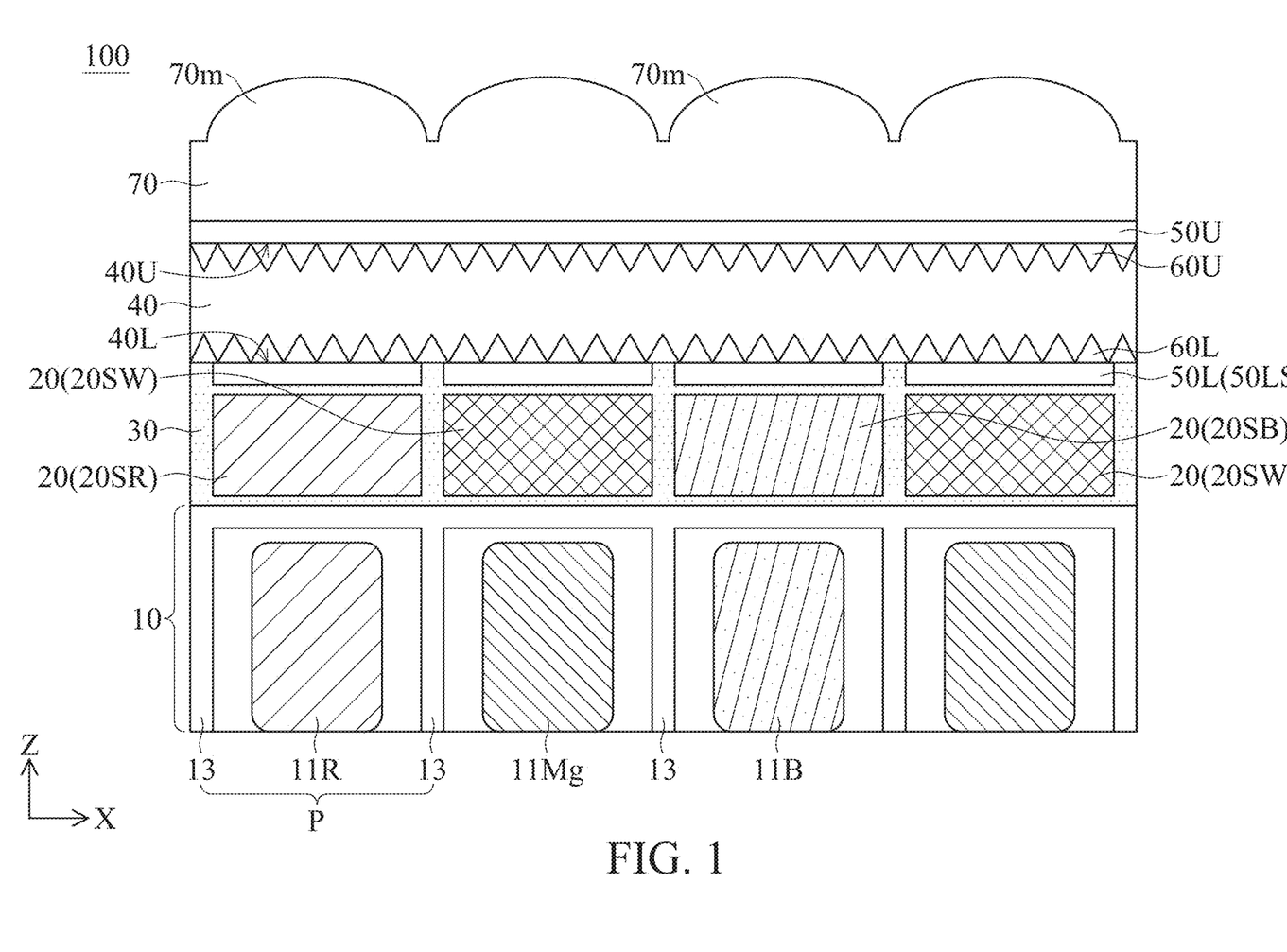
FIG. 1 is a cross-sectional view illustrating a portion of the solid-state image sensor in accordance with some embodiments of the present disclosure.

FIG. 1 is a cross-sectional view illustrating a portion of the solid-state image sensor 100 in accordance with some embodiments of the present disclosure. It should be noted that some components of the solid-state image sensor 100 have been omitted in FIG. 1 for the sake of brevity.

Referring to FIG. 1, in some embodiments, the solid-state image sensor 100 includes a semiconductor substrate 10. The semiconductor substrate 10 may be a wafer or a chip. For example, the semiconductor substrate 10 may include silicon, but the present disclosure is not limited thereto. In some embodiments, the semiconductor substrate 10 has a plurality of photoelectric conversion elements, and each photoelectric conversion element may correspond to one (normal) pixel P, but the present disclosure is not limited thereto.

For example, the semiconductor substrate 10 has a photoelectric conversion element 11R that may be used for receiving red light, a photoelectric conversion element 11Mg that may be used for receiving magenta light, and a photoelectric conversion element 11B that may be used for receiving blue light as shown in FIG. 1, but the present disclosure is not limited thereto. The semiconductor substrate 10 may have other photoelectric conversion elements that may be used for receiving, for example, green light, yellow light, white light, cyan light, or IR/NIR, which may be adjusted depending on actual needs. Referring to FIG. 1, in some embodiments, the solid-state image sensor 100 includes an isolation structure 13 disposed between the photoelectric conversion elements. As shown in FIG. 1, the isolation structure 13 may be disposed between the photoelectric conversion element 11R and the photoelectric conversion element 11Mg, and between the photoelectric conversion element 11Mg and the photoelectric conversion element 11B. For example, the isolation structure 13 may include a shallow trench isolation (STI) or a deep trench isolations (DTI). The isolation structure 13 may be formed in the semiconductor substrate 10 using etching process to form trenches and filling the trenches with an insulating or dielectric material, but the present disclosure is not limited thereto.

As shown in FIG. 1, the isolation structure 13 may separate the photoelectric conversion elements. That is, the photoelectric conversion elements (e.g., 11R, 11Mg, or 11B) in the semiconductor substrate 10 may be isolated from each other by the isolation structure 13, but the present disclosure is not limited thereto.

Referring to FIG. 1, in some embodiments, the solid-state image sensor 100 includes a color filter layer 20 disposed above the semiconductor substrate 10. In some embodiments, the color filter layer 20 has (or is divided into) color filter segments that correspond to the photoelectric conversion elements. For example, as shown in FIG. 1, the color filter layer 20 may have a red color filter segment 20SR that corresponds to the photoelectric conversion element 11R, a white color filter segment 20SW that corresponds to the photoelectric conversion element 11Mg (there are two white color filter segments 20SW and two photoelectric conversion elements 11Mg shown in FIG. 1), and a blue color filter segment 20SB that corresponds to the photoelectric conversion element 11B, but the present disclosure is not limited thereto.

In some other embodiments, the color filter layer 20 has (or is divided into) other color filter segments. For example, the color filter layer 20 may have a green color filter segment, a yellow color filter segment, a white color filter segment, a cyan color filter segment, a magenta color filter segment, or an IR/NIR color filter, but the present disclosure is not limited thereto.

As shown in FIG. 1, in some embodiments, the solid-state image sensor 100 includes a grid structure 30 disposed between the color filter segments. For example, as shown in FIG. 1, the grid structure 30 may be disposed between the red color filter segment 20SR and the white color filter segment 20SW, and between the white color filter segment 20SW and the blue color filter segment 20SB, but the present disclosure is not limited thereto. The grid structure 30 may include a transparent dielectric material that has a low refractive index in a range from about 1.0 to about 1.99. In some embodiments, the refractive index of the grid structure 30 is lower than the refractive index of the color filter layer 20 (that includes red color filter segment 20SR, white color filter segment 20SW, blue color filter segment 20SB, and so on).

The grid structure 30 may be formed by depositing a dielectric layer on the semiconductor substrate 10 and then patterning the dielectric layer using photolithography and etching processes to form the grid structure 30, but the present disclosure is not limited thereto.

Referring to FIG. 1, in some embodiments, the solid-state image sensor 100 includes an organic film 40 disposed above the color filter layer 20. The organic film 40 may be used as an organic photoelectric conversion film, and the organic film 40 may include polycyclic aromatic hydrocarbons (PAH or PAHs), phthalocyanine, the like, or a combination thereof, but the present disclosure is not limited thereto.

Referring to FIG. 1, in some embodiments, the solid-state image sensor 100 includes an upper electrode 50U and a lower electrode 50L respectively disposed on the upper side 40U and the lower side 40L of the organic film 40. The upper electrode 50U and the lower electrode 50L may include a transparent conductive material. For example, the transparent conductive material may include indium tin oxide (ITO), tin oxide (TO), indium zinc oxide (IZO), indium gallium zinc oxide (IGZO), indium zinc tin oxide (ITZO), antimony tin oxide (ATO), or antimony zinc oxide (AZO), but the present disclosure is not limited thereto. As shown in FIG. 1, in some embodiments, the lower electrode 50L has (or is divided into) electrode segments 50LS that correspond to the photoelectric conversion elements (e.g., 11R, 11Mg, or 11B).

The upper electrode 50U and the lower electrode 50L may be disposed on the upper side 40U and the lower side 40L of the organic film 40 by a deposition process and/or a photolithography process, but the present disclosure is not limited thereto.

Referring to FIG. 1, in some embodiments, the solid-state image sensor 100 includes nano-structures 60U disposed on the upper side 40U of the organic film 40 and nano-structures 60L disposed on the lower side 40L of the organic film 40. That is, the nano-structures (60U or 60L) are disposed inside the organic film 40 and disposed on both sides of the organic film 40. In some other embodiments, the nano-structures (60U or 60L) are disposed on the upper side 40U and/or the lower side 40L of the organic film 40. That is, the nano-structures (60U or 60L) may be disposed on only one side of the organic film 40.

In some embodiments, the nano-structures 60U and 60L include a transparent conductive material that is the same as or similar to the upper electrode 50U and the lower electrode 50L. In some embodiments, the nano-structures 60U and 60L are a portion of the upper electrode 50U and the lower electrode 50L. For example, a surface roughening treatment may be performed on the upper electrode 50U or the lower electrode 50L to form nano-structures 60U or 60L, but the present disclosure is not limited thereto. In some other embodiments, the nano-structures 60U and 60L include a metal. For example, the metal may include gold (Au), nickel (Ni), platinum (Pt), palladium (Pd), iridium (Ir), titanium (Ti), chromium (Cr), tungsten (W), aluminum (Al), copper (Cu), the like, an alloy thereof, or a combination thereof, but the present disclosure is not limited thereto.

As shown in FIG. 1, in some embodiments, the solid-state image sensor 100 includes a condensing structure 70 disposed on the organic film 40 for condensing incident light. The condensing structure 70 may include glass, epoxy resin, silicone resin, polyurethane, any other applicable material, or a combination thereof, but the present disclosure is not limited thereto. For example, the condensing structure 70 may be formed by a photoresist reflow method, a hot embossing method, any other applicable method, or a combination thereof. Moreover, the steps of forming the condensing structure 70 may include a spin coating process, a lithography process, an etching process, any other applicable process, or a combination thereof, but the present disclosure is not limited thereto.

As shown in FIG. 1, in some embodiments, the condensing structure 70 includes micro-lenses 70m that correspond to the color filter segments (e.g., 20SR, 20SW, or 20SB). In other words, micro-lenses 70m may also correspond to the photoelectric conversion elements (e.g., 11R, 11Mg, or 11B), but the present disclosure is not limited thereto. In some embodiments, the micro-lenses 70m are formed as an m×n array, wherein m and n are positive integers.

In the embodiment shown in FIG. 1, each micro-lens 70m corresponds to one color filter segment and/or one photoelectric conversion element, but the present disclosure is not limited thereto. In some other embodiments, each micro-lens 70m corresponds to at least two (i.e., two or more) color filter segments and/or at least two (i.e., two or more) photoelectric conversion elements. That is, the number of micro-lenses 70m is not limited to the embodiment shown in FIG. 1, which may be adjusted depending on actual needs.

The micro-lens 70m may include a semi-convex lens or a convex lens, but the present disclosure is not limited thereto. The condensing structure 70 may also include micro-pyramid structures (e.g., circular cone, quadrangular pyramid, and so on), or micro-trapezoidal structures (e.g., flat top cone, truncated square pyramid, and so on). Alternatively, the condensing structure 70 may be a gradient-index structure.

Figure 2:
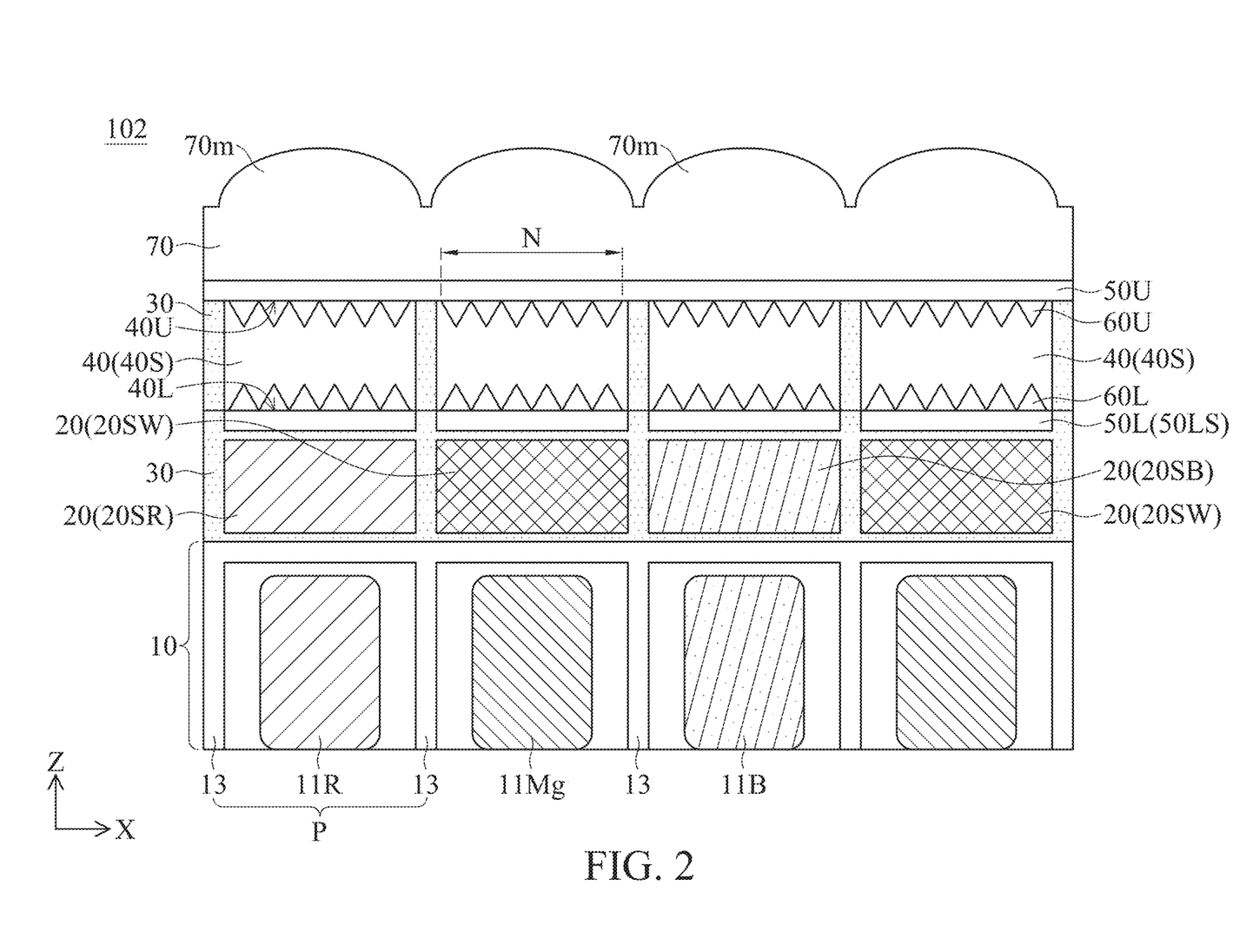
FIG. 2 is a cross-sectional view illustrating a portion of the solid-state image sensor in accordance with some embodiments of the present disclosure.

FIG. 2 is a cross-sectional view illustrating a portion of the solid-state image sensor 102 in accordance with some embodiments of the present disclosure. Similarly, some components of the solid-state image sensor 102 have been omitted in FIG. 2 for the sake of brevity.

The solid-state image sensor 102 shown in FIG. 2 has a similar structure to the solid-state image sensor 100 shown in FIG. 1. The main difference from the solid-state image sensor 100 shown in FIG. 1 is that the organic film 40 of the solid-state image sensor 102 shown in FIG. 2 has (or is divided into) organic segments 40S. In more detail, in some embodiments, the grid structure 30 is also disposed between the organic segments 40S. In other word, the grid structure 30 may extend from the color filter layer 20 into the organic film 40, so that the organic film 40 may be divided into organic segments 40S by the grid structure 30, but the present disclosure is not limited thereto.

In some embodiments, the refractive index of the grid structure 30 is lower than the refractive index of the organic film 40 (or the organic segments 40S). As shown in FIG. 2, the length N of the nano-structures in each organic segment 40S may be the same. In some embodiments, the length N of the nano-structures in each organic segment 40S is between about 200 μm and about 500 μm.

Figure 3:
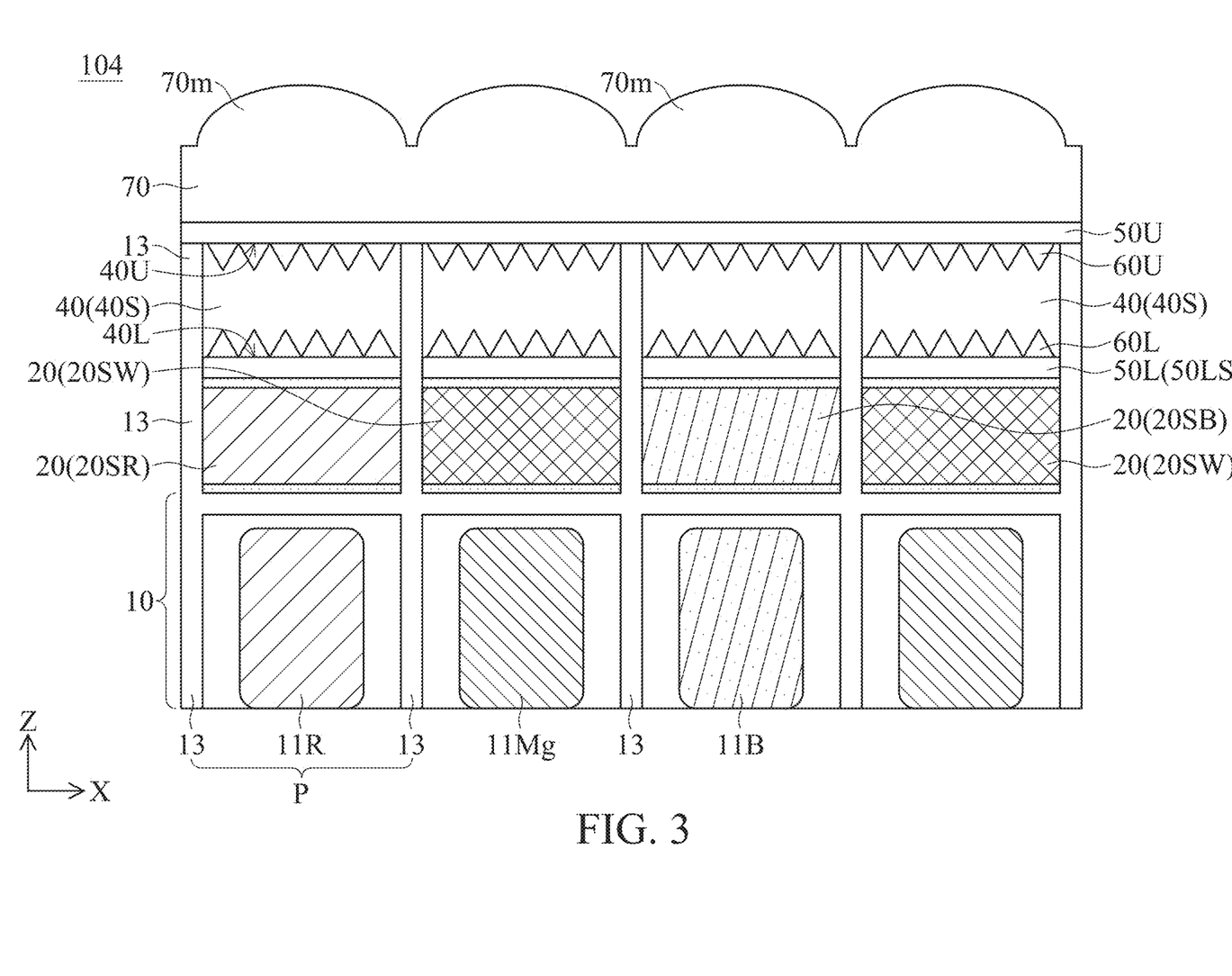
FIG. 3 is a cross-sectional view illustrating a portion of the solid-state image sensor in accordance with some embodiments of the present disclosure.

FIG. 3 is a cross-sectional view illustrating a portion of the solid-state image sensor 104 in accordance with some embodiments of the present disclosure. Similarly, some components of the solid-state image sensor 104 have been omitted in FIG. 3 for the sake of brevity.

The solid-state image sensor 104 shown in FIG. 3 has a similar structure to the solid-state image sensor 100 shown in FIG. 1. The main difference from the solid-state image sensor 100 shown in FIG. 1 is that the isolation structure 13 replaces the grid structure 30 and is disposed between the color filter segments (e.g., 20SR, 20SW, and 20SB) in solid-state image sensor 104 shown in FIG. 3.

Moreover, the organic film 40 of the solid-state image sensor 104 shown in FIG. 3 has (or is divided into) organic segments 40S. In some embodiments, the isolation structure 13 is also disposed between the organic segments 40S. In other word, the isolation structure 13 may extend from the substrate 10 into the color filter layer 20 and the organic film 40, so that the color filter layer 20 may be divided into color filter segments (e.g., 20SR, 20SW, or 20SB) by the isolation structure 13, and the organic film 40 may be divided into organic segments 40S by the isolation structure 13, but the present disclosure is not limited thereto.

Figure 4:
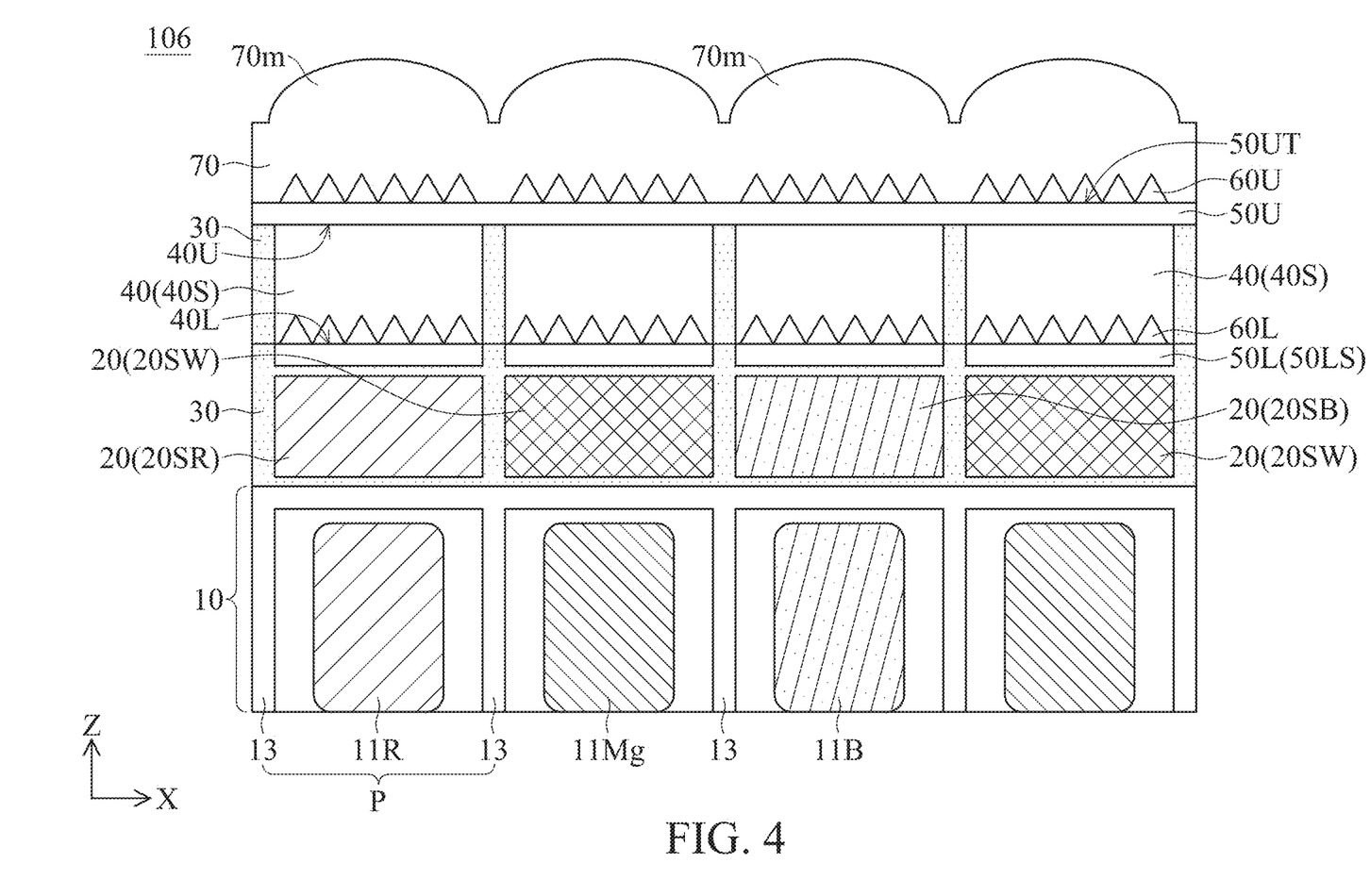
FIG. 4 is a cross-sectional view illustrating a portion of the solid-state image sensor in accordance with some embodiments of the present disclosure.

FIG. 4 is a cross-sectional view illustrating a portion of the solid-state image sensor 106 in accordance with some embodiments of the present disclosure. Similarly, some components of the solid-state image sensor 106 have been omitted in FIG. 4 for the sake of brevity.

The solid-state image sensor 106 shown in FIG. 4 has a similar structure to the solid-state image sensor 102 shown in FIG. 2. The main difference from the solid-state image sensor 102 shown in FIG. 2 is that the nano-structures 60U of the solid-state image sensor 106 shown in FIG. 4 are disposed on the upper side 50UT of the upper electrode 50. In other word, some nano-structures (e.g., 60U) may be disposed outside the organic film 40.

Figure 5:
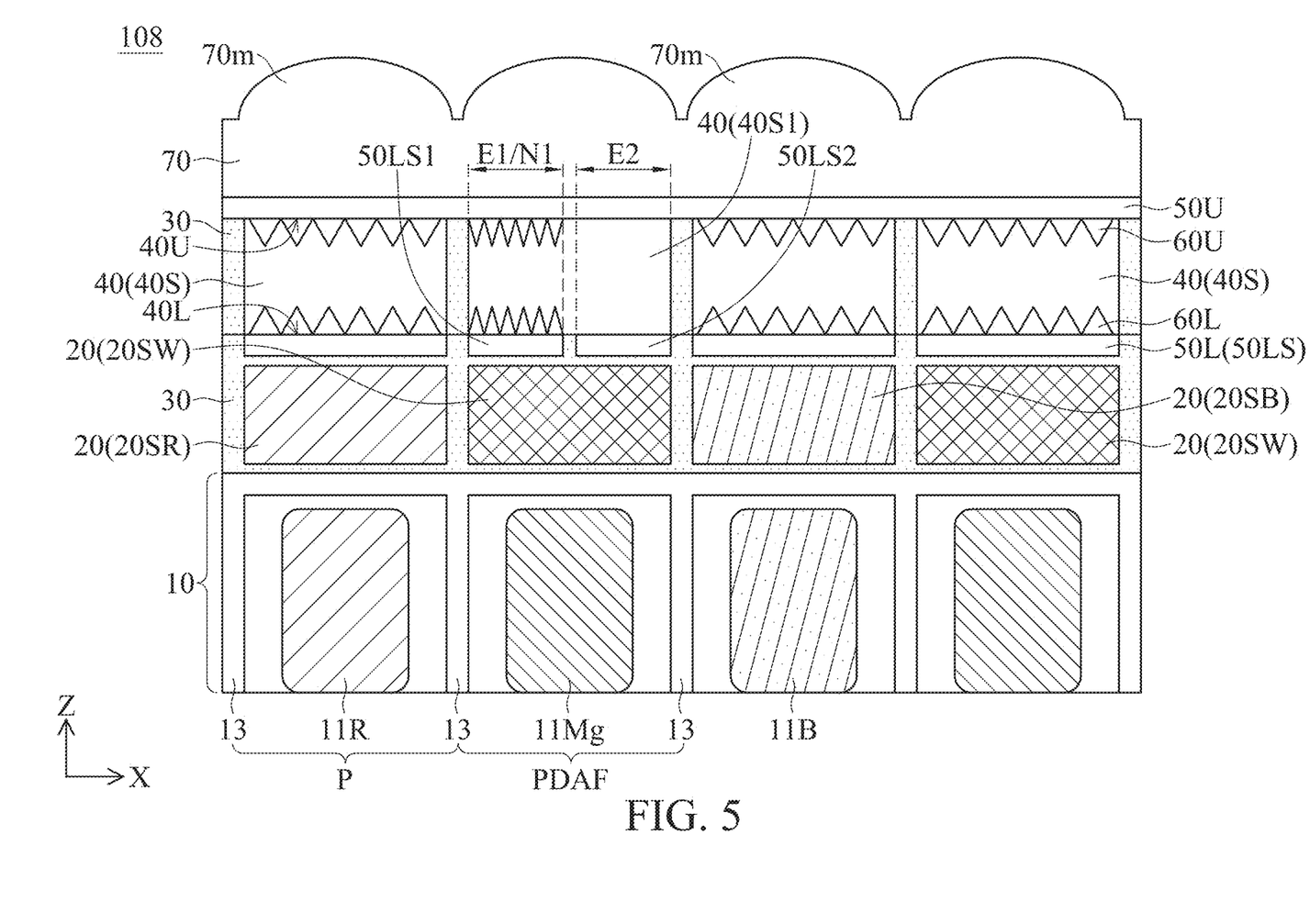
FIG. 5 is a cross-sectional view illustrating a portion of the solid-state image sensor in accordance with some embodiments of the present disclosure.

FIG. 5 is a cross-sectional view illustrating a portion of the solid-state image sensor 108 in accordance with some embodiments of the present disclosure. Similarly, some components of the solid-state image sensor 108 have been omitted in FIG. 5 for the sake of brevity.

The solid-state image sensor 108 shown in FIG. 5 has a similar structure to the solid-state image sensor 102 shown in FIG. 2. The main difference from the solid-state image sensor 102 shown in FIG. 2 is that one electrode segment 50LS of the lower electrode 50L in the solid-state image sensor 108 shown in FIG. 5 includes (or is divided into) a first electrode segment 50LS1 and a second electrode segment 50LS2.

In the embodiment shown in FIG. 5, the first electrode segment 50LS1 and the second electrode segment 50LS2 correspond to the white color filter segment 20SW, but the present disclosure is not limited thereto. In some other embodiments, the first electrode segment 50LS1 and the second electrode segment 50LS2 correspond to the red color filter segment 20SR, the blue color filter segment 20SB, or any other color filter segment. Moreover, there may be more than one electrode segment 50LS of the lower electrode 50L that include (or are divided into) the first electrode segment 50LS1 and the second electrode segment 50LS2. In some embodiments, the first electrode segment 50LS1 and the second electrode segment 50LS2 and the corresponding photoelectric conversion element 11Mg may be used to correspond to one phase detection auto focus (PDAF) pixel (which is labeled as PDAF in FIG. 5).

As shown in FIG. 5, in some embodiments, the first electrode segment 50LS1 and the second electrode segment 50LS2 are disposed on the lower side 40L of the organic segment 40S1. In the embodiment shown in FIG. 5, the length E1 of the first electrode segment 50LS1 is equal to the length E2 of the second electrode segment 50LS2. Moreover, in some embodiments, the length N1 of the nano-structures 60U or 60L in the organic segment 40S1 corresponds to the length E1 of the first electrode segment 50LS1. For example, the length N1 of the nano-structures 60U or 60L in the organic segment 40S1 may be equal to the length E1 of the first electrode segment 50LS1, but the present disclosure is not limited thereto.

Figure 6:
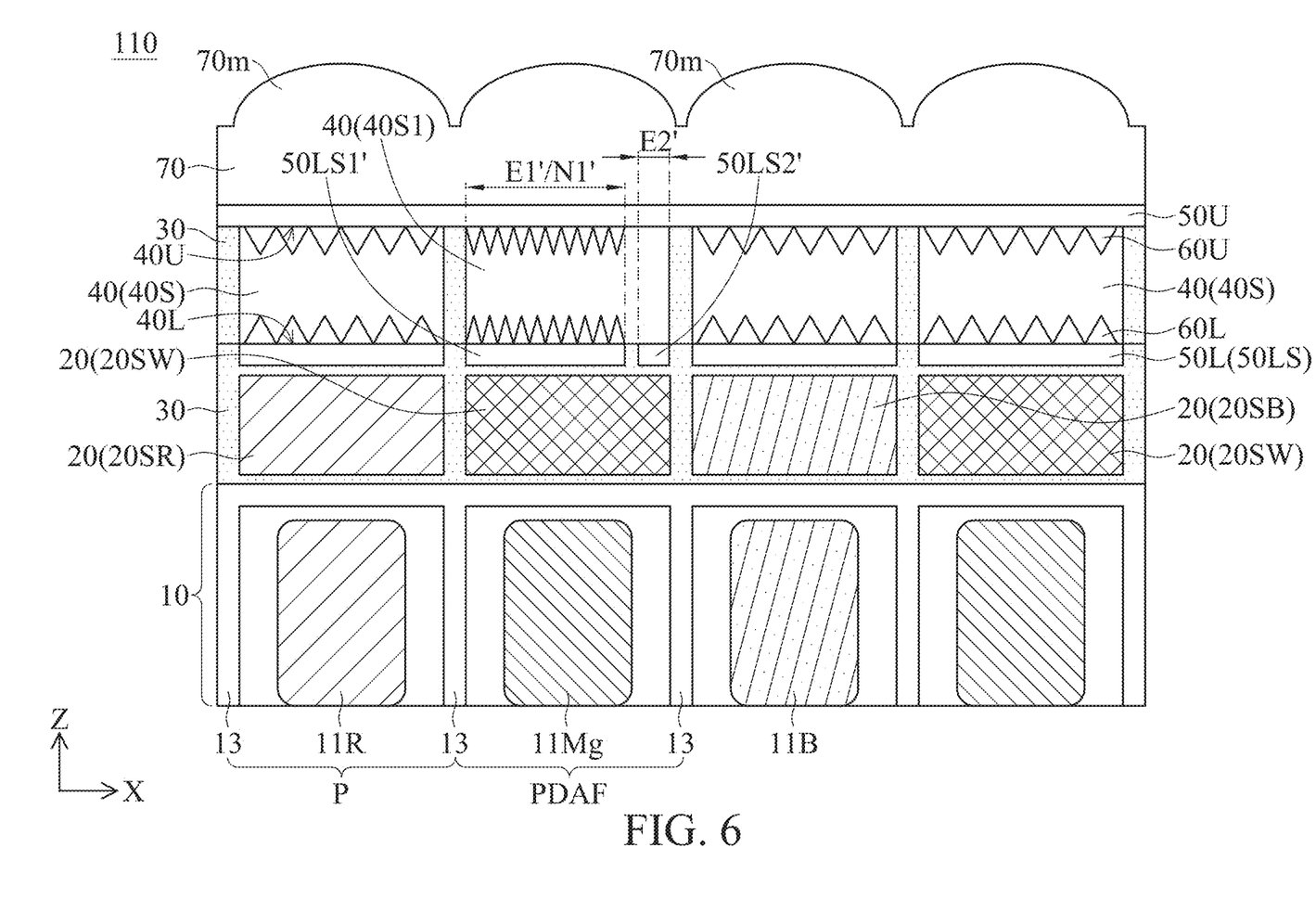
FIG. 6 is a cross-sectional view illustrating a portion of the solid-state image sensor in accordance with some embodiments of the present disclosure.

FIG. 6 is a cross-sectional view illustrating a portion of the solid-state image sensor 110 in accordance with some embodiments of the present disclosure. Similarly, some components of the solid-state image sensor 110 have been omitted in FIG. 6 for the sake of brevity.

The solid-state image sensor 110 shown in FIG. 6 has a similar structure to the solid-state image sensor 108 shown in FIG. 5. The main difference from the solid-state image sensor 108 shown in FIG. 5 is that the length E1' of the first electrode segment 50LS1' is different from the length E2' of the second electrode segment 50LS2' in the solid-state image sensor 110 shown in FIG. 6. In more detail, the length E1' of the first electrode segment 50LS1' may be greater than the length E2' of the second electrode segment 50LS2', but the present disclosure is not limited thereto. Similarly, in some embodiments, the length N1' of the nano-structures 60U or 60L in the organic segment 40S1 corresponds to the length E1' of the first electrode segment 50LS1'. For example, the length N1' of the nano-structures 60U or 60L in the organic segment 40S1 may be equal to the length E1' of the first electrode segment 50LS1', but the present disclosure is not limited thereto.

Figure 7A:
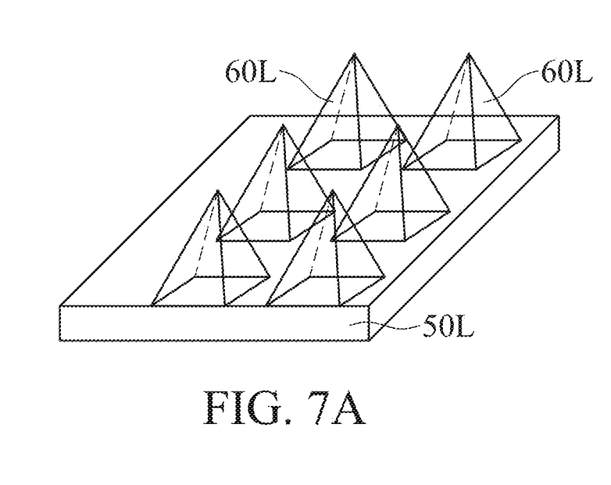
FIG. 7A, FIG. 7B, and FIG. 7C are different examples of the nano-structures.
Figure 7B:
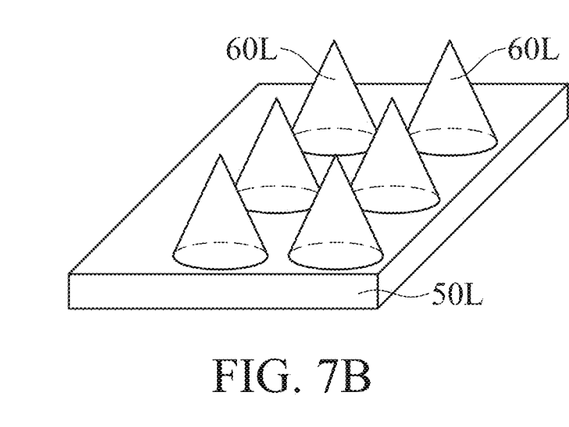
Figure 7C:
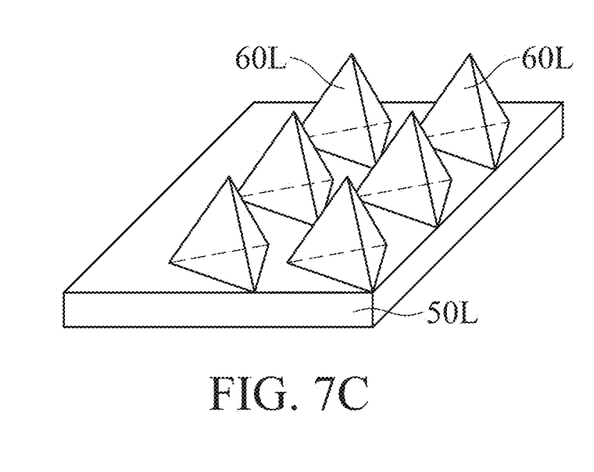

FIG. 7A, FIG. 7B, and FIG. 7C are different examples of the nano-structures 60L. It should be noted that the nano-structures 60U may have a shape the same as or similar to that of the nano-structures 60L. As shown in FIG. 7A, each nano-structure 60L (or 60U) is formed into a quadrangular pyramid. As shown in FIG. 7B, each nano-structure 60L (or 60U) is formed into a cone. As shown in FIG. 7C, each nano-structure 60L (or 60U) is formed into a triangular pyramid. However, the shape of each nano-structure 60L (or 60U) is not limited to the examples shown in FIG. 7A, FIG. 7B, and FIG. 7C, which may be adjusted depending on actual needs.

In summary, the solid-state image sensor according to some embodiments of the present disclosure includes nano-structures disposed on the upper side and/or the lower side of the organic film (e.g., organic photoelectric conversion film), which may effectively enhance the photoelectric conversion efficiency, thereby improving the quality of the image signal from the photoelectric conversion elements of the solid-state image sensors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A solid-state image sensor, comprising:
    a semiconductor substrate having photoelectric conversion elements;
    an isolation structure disposed between the photoelectric conversion elements;
    a color filter layer disposed above the semiconductor substrate and having color filter segments corresponding to the photoelectric conversion elements;
    an organic film disposed above the color filter layer, wherein the organic film has organic segments;
    an upper electrode and a lower electrode respectively disposed on and contacted with an upper surface and a lower surface of the organic film;
    nano-structures disposed on the upper surface or the lower surface of the organic film, wherein the nano-structures include nano-structure segments contacted with the organic segments of the organic film; and
    a grid structure disposed between the nano-structure segments of the nano-structures and between the organic segments of the organic film;
    wherein one of the nano-structure segments of the nano-structures is deposited corresponding to one of the organic segments of the organic film and one of the color filter segments of the color filter layer.

2. The solid-state image sensor as claimed in claim 1, wherein the grid structure is disposed between the color filter segments.

3. The solid-state image sensor as claimed in claim 2, wherein a refractive index of the grid structure is lower than a refractive index of the color filter layer.

4. The solid-state image sensor as claimed in claim 1, wherein a refractive index of the grid structure is lower than a refractive index of the organic film.

5. The solid-state image sensor as claimed in claim 1, wherein the isolation structure is also disposed between the color filter segments.

6. The solid-state image sensor as claimed in claim 1, wherein a length of the nano-structures in each of the organic segments is between 200 μm and 500 μm.

7. The solid-state image sensor as claimed in claim 1, wherein the nano-structures are disposed on an upper side of the upper electrode.

8. The solid-state image sensor as claimed in claim 1, wherein the lower electrode has electrode segments corresponding to the photoelectric conversion elements.

9. The solid-state image sensor as claimed in claim 8, wherein one of the electrode segments comprises a first electrode segment and a second electrode segment that correspond to one of the color filter segments.

10. The solid-state image sensor as claimed in claim 9, wherein a length of the first electrode segment is different from a length of the second electrode segment.

11. The solid-state image sensor as claimed in claim 9, the first electrode segment and the second electrode segment are disposed on a lower side of a specific organic segment of the organic segments.

12. The solid-state image sensor as claimed in claim 11, wherein a length of the nano-structures in the specific organic segment corresponds to a length of the first electrode segment.

13. The solid-state image sensor as claimed in claim 1, wherein the nano-structures are extended from the upper electrode or the lower electrode.

14. The solid-state image sensor as claimed in claim 1, wherein each of the nano-structures is formed into a triangular pyramid, a cone, or a quadrangular pyramid.

15. The solid-state image sensor as claimed in claim 1, wherein the nano-structures comprise a transparent conductive material or a metal.

16. The solid-state image sensor as claimed in claim 1, further comprising:
    a condensing structure disposed on the organic film, wherein the condensing structure comprises microlenses that correspond to the color filter segments.

* * * * *